United States Patent
Berry et al.

(10) Patent No.: US 10,242,966 B1
(45) Date of Patent: Mar. 26, 2019

(54) THIN BONDED INTERPOSER PACKAGE

(71) Applicant: Amkor Technology, Inc., Tempe, AZ (US)

(72) Inventors: Christopher J. Berry, Chandler, AZ (US); Roger D. St. Amand, Tempe, AZ (US); Jin Seong Kim, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 15/650,205

(22) Filed: Jul. 14, 2017

Related U.S. Application Data

(63) Continuation of application No. 14/172,889, filed on Feb. 4, 2014, now Pat. No. 9,711,485.

(51) Int. Cl.
*H01L 23/00* (2006.01)
*H01L 23/12* (2006.01)
*H01L 23/31* (2006.01)
*H01L 21/56* (2006.01)

(52) U.S. Cl.
CPC ............ *H01L 24/97* (2013.01); *H01L 21/565* (2013.01); *H01L 23/12* (2013.01); *H01L 23/3157* (2013.01); *H01L 24/11* (2013.01); *H01L 24/14* (2013.01)

(58) Field of Classification Search
CPC ....... H01L 24/14; H01L 24/97; H01L 21/565; H01L 24/11
See application file for complete search history.

(56) References Cited

U.S. PATENT DOCUMENTS

| | | | |
|---|---|---|---|
| 7,358,603 B2 | 4/2008 | Li et al. | |
| 7,777,351 B1 | 8/2010 | Berry et al. | |
| 8,319,338 B1 | 11/2012 | Berry et al. | |
| 9,553,059 B2 * | 1/2017 | Tsai | H01L 21/486 |
| 2001/0026010 A1 | 10/2001 | Horiuchi et al. | |
| 2002/0063321 A1 | 5/2002 | Sauter et al. | |
| 2006/0220210 A1 | 10/2006 | Kamezos et al. | |
| 2009/0000107 A1* | 1/2009 | Koch | G06K 19/07749 |
| | | | 29/601 |
| 2010/0044845 A1 | 2/2010 | Funaya et al. | |
| 2010/0127374 A1 | 5/2010 | Cho | |
| 2010/0140779 A1 | 6/2010 | Lin | |
| 2010/0252937 A1 | 10/2010 | Uchiyama | |
| 2011/0068427 A1 | 3/2011 | Paek | |
| 2011/0068459 A1 | 3/2011 | Pagaila et al. | |
| 2011/0298101 A1* | 12/2011 | Pagaila | H01L 21/561 |
| | | | 257/659 |

(Continued)

*Primary Examiner* — Michele Fan
(74) *Attorney, Agent, or Firm* — McAndrews, Held & Malloy, Ltd.

(57) ABSTRACT

Methods and systems for a thin bonded interposer package are disclosed and may, for example, include bonding a semiconductor die to a first surface of a substrate, forming contacts on the first surface of the substrate, encapsulating the semiconductor die, formed contacts, and first surface of the substrate using a mold material while leaving a top surface of the semiconductor die not encapsulated by mold material, forming vias through the mold material to expose the formed contacts. A bond line may be dispensed on the mold material and the semiconductor die for bonding the substrate to an interposer. A thickness of the bond line may be defined by standoffs formed on the top surface of the semiconductor die.

20 Claims, 7 Drawing Sheets

(56) References Cited

U.S. PATENT DOCUMENTS

| | | | |
|---|---|---|---|
| 2012/0038034 A1* | 2/2012 | Shin | H01L 25/16 |
| | | | 257/676 |
| 2012/0056329 A1* | 3/2012 | Pagaila | H01L 21/56 |
| | | | 257/774 |
| 2012/0074592 A1* | 3/2012 | Luan | H01L 25/16 |
| | | | 257/777 |
| 2012/0091597 A1 | 4/2012 | Kwon et al. | |
| 2012/0104624 A1 | 5/2012 | Choi et al. | |
| 2012/0223429 A1* | 9/2012 | Khan | H01L 23/552 |
| | | | 257/738 |
| 2012/0225522 A1* | 9/2012 | Zhao | H01L 25/105 |
| | | | 438/107 |
| 2012/0267782 A1 | 10/2012 | Chen | |
| 2012/0313207 A1* | 12/2012 | Oganesian | H01L 24/19 |
| | | | 257/433 |
| 2013/0075924 A1* | 3/2013 | Lin | H01L 24/19 |
| | | | 257/774 |
| 2013/0078915 A1 | 3/2013 | Zhao et al. | |
| 2014/0048906 A1 | 2/2014 | Shim et al. | |
| 2014/0048913 A1* | 2/2014 | Park | H01L 23/552 |
| | | | 257/659 |
| 2014/0070407 A1* | 3/2014 | Lee | H01L 23/49816 |
| | | | 257/737 |
| 2014/0084416 A1 | 3/2014 | Kang | |
| 2014/0110856 A1 | 4/2014 | Lin | |
| 2014/0183732 A1 | 7/2014 | Huang et al. | |
| 2014/0264842 A1 | 9/2014 | Lin et al. | |

\* cited by examiner

10,242,966 B1

THIN BONDED INTERPOSER PACKAGE

This application is a continuation of U.S. patent application Ser. No. 14/172,889, filed Feb. 4, 2014, and titled "A THIN BONDED INTERPOSER PACKAGE," which is hereby incorporated herein by reference in its entirety.

FIELD

Certain embodiments of the disclosure relate to semiconductor chip packaging. More specifically, certain embodiments of the disclosure relate to a method and system for a thin bonded interposer package.

BACKGROUND

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprises ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present disclosure as set forth in the remainder of the present application with reference to the drawings.

DETAILED DESCRIPTION

Certain aspects of the disclosure may be found in a thin bonded interposer package. Example aspects of the disclosure may comprise bonding a semiconductor die to a first surface of the substrate, forming contacts on the first surface of the substrate, encapsulating the semiconductor die, formed contacts, and a first surface of the substrate using a mold material while leaving a top surface of the semiconductor die not encapsulated by mold material, and forming vias through the mold material to expose the formed contacts. A bond line may be dispensed on the mold material and the semiconductor die, and the substrate may be bonded to an interposer using the dispensed bond line on the mold material and semiconductor die. The interposer may be electrically coupled to the metal contacts in the vias on the exposed portion of the first surface of the substrate using metal contacts formed on the interposer. A thickness of the bond line may be defined by standoffs formed on the bottom surface of the interposer and/or the top surface of the semiconductor die. The bond line may be dispensed such that it extends laterally beyond the final outer edges of the interposer. The interposer, mold material, bond line, and substrate may be sawn within the outer edges of the interposer so as to achieve the final x-y dimensions. The metal contacts in the mold vias on the exposed portion of the first surface of the substrate and the metal contacts formed on the interposer may comprise one or more of: solder balls and/or copper pillars/posts. An embedded thermal element may be formed in the interposer, with the thermal element being in thermal contact with a surface of the semiconductor die. The embedded thermal element may comprise one or both of: thermally conductive epoxy and/or solderable material. Metal contacts may be formed on a second surface of the substrate. Vias may electrically couple a subset of the metal contacts on the first surface of the substrate to a subset of the metal contacts on the second surface of the substrate. The interposer may be in strip or singulated form when the package is bonded to the interposer in an inverted interposer bonding process.

Figure 1:
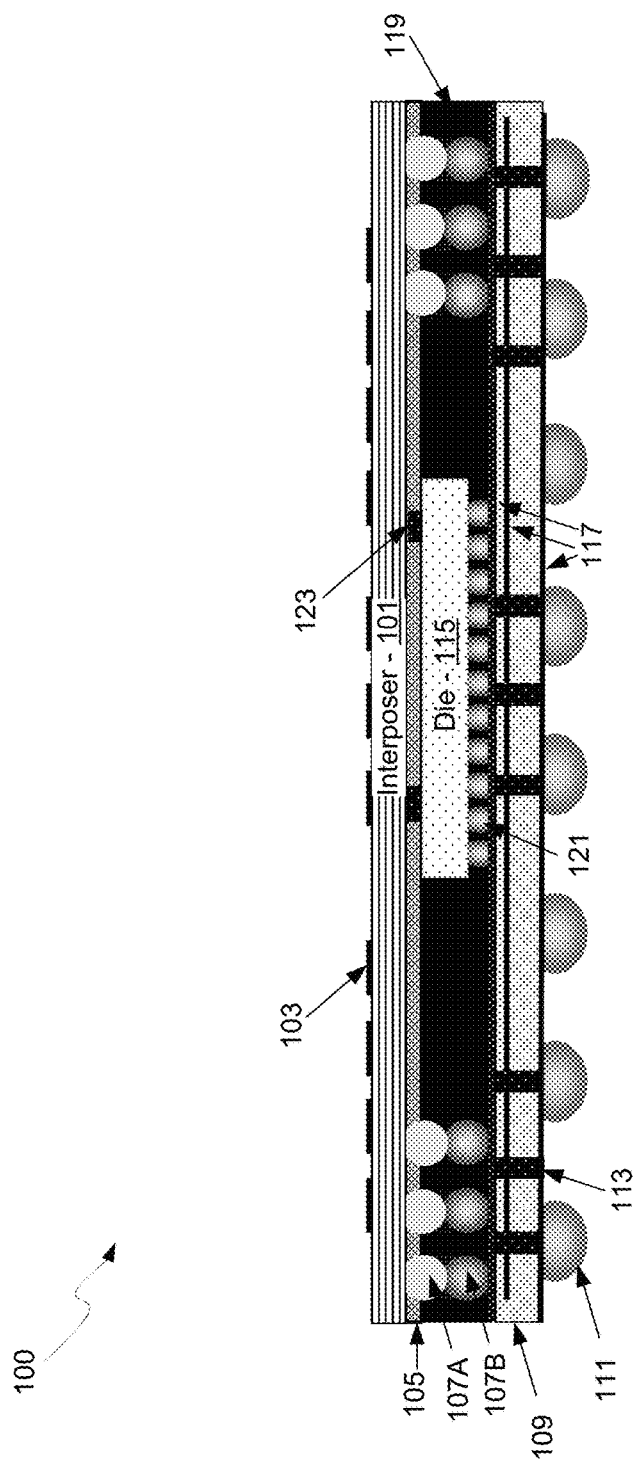
FIG. 1 is a schematic illustrating a thin bonded interposer package, in accordance with an example embodiment of the disclosure.

FIG. 1 is a schematic illustrating a thin bonded interposer package, in accordance with an example embodiment of the disclosure. Referring to FIG. 1, there is shown a package 100 comprising an interposer 101, a semiconductor die 115, and a substrate 109 (e.g., dielectric/metal laminate, or other material), with a mold material 119 between the interposer 101 and substrate 109 encapsulating the semiconductor die 115.

The semiconductor die 115 may comprise an integrated circuit die that has been separated from a semiconductor wafer and may have conductive bumps 121 (e.g., comprising solder and/or any of a variety of other conductive materials) formed on one surface to provide electrical connection to the substrate 109. The semiconductor die 115 may comprise electrical circuitry such as microprocessors, digital signal processors (DSPs), network processors, power management units, audio processors, RF circuitry, wireless baseband system-on-chip (SoC) processors, sensors, and application specific integrated circuits, for example.

The interposer 101 may comprise a multi-layer structure with metal and dielectric layers that provide electrical interconnectivity and isolation, respectively, for devices and structures bonded to the interposer 101. The metal pads 103 on the interposer 101 may comprise contact pads for receiving conductive bumps or other contact types from subsequently bonded semiconductor die or other devices (e.g., memory chip packages, or discrete capacitors and the like) such as may be used in package stacking.

The substrate, or base laminate, 109 may comprise metal layers, such as the metal layers 117, for electrical connectivity laterally in the substrate 109, dielectric layers for electrical isolation between the metal layers 117, and vias 113 for electrical connectivity through the substrate 109. In an example scenario, the vias 113 may comprise core, blind, or through vias, for example and may provide electrical connectivity from the substrate top surface to the solder balls 111, which may provide electrical and mechanical connectivity of the package 100 to a printed circuit board, for example. The vias 113 may be formed by drilling through the laminate substrate and plating with metal to provide an electrical interconnect between top and bottom surfaces or any other process as utilized in laminate substrate manufacturing such as laser drilling and subsequent filling with plated copper. While the interposer 101 and substrate 109 as shown may comprise organic laminate structures, they are not so limited, and may comprise any multi-layer structure or glass, for example.

The mold material 119 may, for example, comprise a glass-filled polymer (e.g., so-called mold compound) that may be formed on the substrate 109 and encapsulating the bottom and/or side surfaces of the die 115. The mold material 119 may provide mechanical support for the package 100 and protection from environmental elements for the semiconductor die 115. This is in contrast to chip-in-substrate (CIS) structures wherein no mold compound is used but instead the semiconductor die are embedded in the core layer of the substrate itself which creates a number of process, design, yield, and cost problems. This is also in contrast to other known interposer-related package processes (e.g., MCeP). In other such processes, the interposer is joined to the substrate before encapsulation and there is no distinct bond line between the interposer and the mold compound and the interposer and the die.

To achieve the exposed die condition with no mold on the back of the die, a film assisted molding technique may be used to leave the back side of the die exposed, or free from mold compound in the as-molded state so that no subsequent grinding or polishing is required. In film assisted molding, a compliant film may be stretched on the upper surface inside of the mold tool cavity such that when the mold tool is closed, the film presses on the backside of the semiconductor die and effectively "gaskets" the backside of the die therefore, excluding mold compound from this region.

The package 100 may also comprise metal contacts 107A and 107B formed on the interposer 101 and the substrate 109, respectively, for providing electrical connectivity between the interposer 101 and the substrate 109. Vias may be formed in the mold material 119 for the metal contacts 107A and 107B. In an example scenario, the mold material 119, once formed, may be ablated to form vias for the metal contacts 107A and 107B. The vias may be conical in shape, but are not limited to this shape. For example, once via openings are formed, the metal contacts 107B may be formed on metal pads (which are not shown but may be similar to the metal pads 103) on the substrate 109, and the metal contacts 107A may be formed on the interposer 101 (e.g., on metal pads). Alternately, the contact metal 107B may be applied before the molding and ablation (as in FIG. 3) and the ablation simply opens a contact window onto 107B. In this manner, the interposer 101 and the substrate 109 may be electrically coupled by bonding the metal contacts 107A to the metal contacts 107B. The metal contacts 107A and 107B may comprise conductive balls (e.g., solder balls) and/or copper posts, for example, but are not limited to such contacts.

The bond line 105 may comprise an adhesive layer formed on the semiconductor die 115 and the mold material 119 for bonding to the interposer 101. Since the bond line 105 may comprise a full body bond line (e.g., extending completely across the top surface of both the die 115 and the encapsulant 119), the adhesive bond line encapsulates interface joints and intimately bonds the interposer 101 to the base package element comprising the substrate 109, the die 115, and the mold material 119. In an example scenario, the bond line 105 may be applied to the semiconductor die 115 and the mold material 119 beyond the edge of where the mold material 119 will be sawn when individual packages are diced. This is shown further with respect to FIGS. 6A and 6B.

The bond line coverage area may or may not be equal to the full package body area, meaning that the bond line material may extend all the way out to the edge of the package on all four sides or it may be recessed from the package edge. Either one of these outcomes may be achieved by tailoring the volume and pattern of dispensed material.

In an example scenario, the semiconductor die 115 may comprise a processor, and one or more memory die may be bonded to the metal pads 103 on the interposer 101. The interposer 101, the metal contacts 107A and 107B, and the substrate 109 may provide electrical connectivity between bonded memory die and the semiconductor die 115. By utilizing an interposer that extends above the semiconductor die 115 as well as beyond the edges of the die, metal contacts may be formed across the entire surface above the die (and not just above the mold compound), providing a higher density contact capability with better thermal conductivity, unlike current standard package-on-package configurations (e.g., JEDEC standard), which prevent direct contact between the back of the die and any form of heat spreader for good thermal management, and which required the top package in the stack to be the same body size as the base package, and which limit the number of package to package connections therefore limiting the bandwidth of the connection.

In addition, standoffs 123 may be formed between the semiconductor die 115 and the interposer 101, which may provide a degree of bond line management. The standoffs 123, may comprise solder resist or other dispensed material or applied film, for example, and may be formed on the bottom surface of the interposer 101 or on the top surface of the die 115. For example, features of controlled thickness such as small solder resist islands may be formed on the bottom side of the interposer, or the top of the die. In this example scenario, the standoffs 123 may act as spacers such that when the interposer is bonded to the substrate under force, the bond line is set at the value determined by the spacer and not left up to a naturally occurring gap such as would otherwise be the case. Accordingly, the bond line 105 may be a well-defined thickness between the interposer 101 and the semiconductor die 115 and may be configured to be matched with the thickness at the metal contacts 107A and 107B. Such a configuration may, for example, improve planarity when the interposer 101 is bonded to the semiconductor die 115 and the mold material 119.

Figure 2:
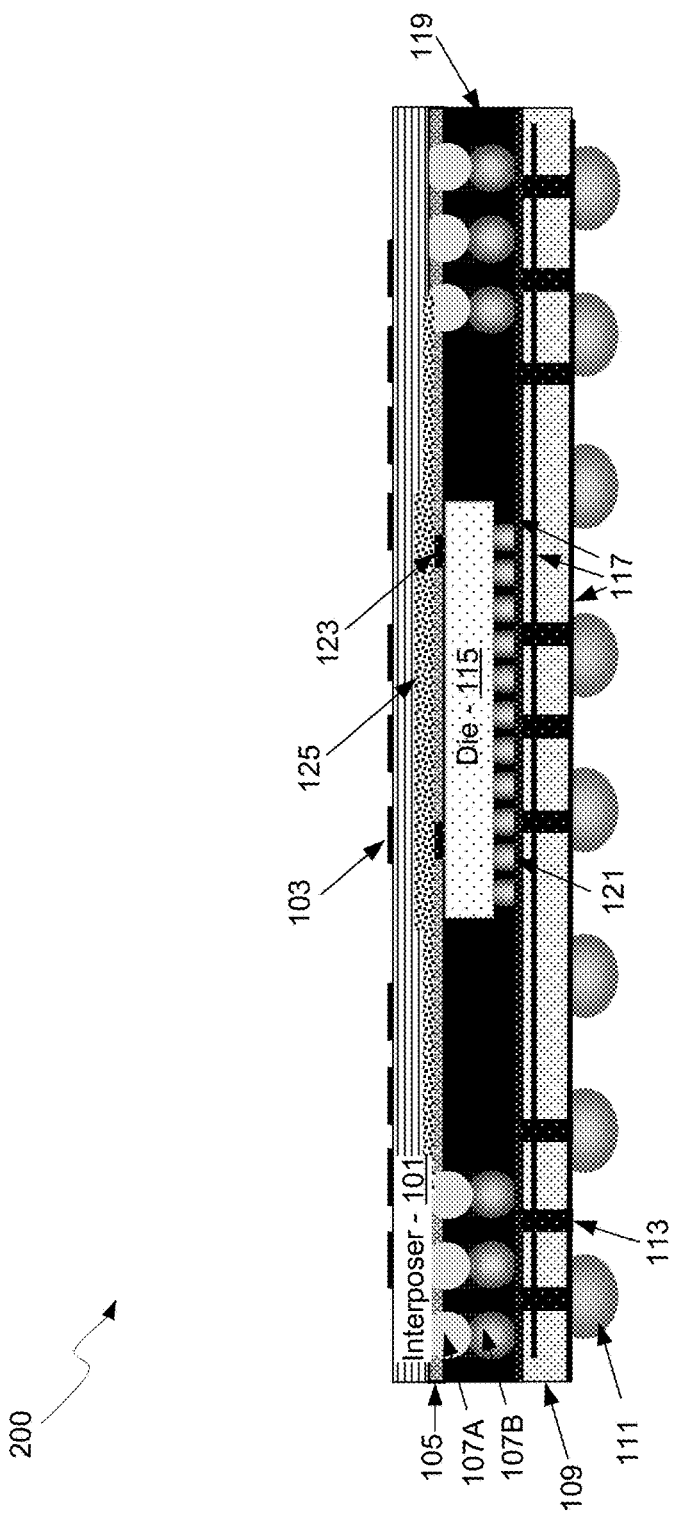
FIG. 2 is a schematic illustrating a thin bonded interposer package with an embedded thermal element, in accordance with an example embodiment of the disclosure.

FIG. 2 is a schematic illustrating a thin bonded interposer package with an embedded thermal element, in accordance with an example embodiment of the disclosure. Referring to FIG. 2, there is shown a package 200 with similar elements to the package 100, such as the interposer 101, package 109, semiconductor die 115, metal contacts 107A and 107B, mold material 119, bond line 105, and solder resist standoffs 123.

There is also shown an embedded thermal element 125, which may comprise thermally conductive epoxy and/or solderable material, such as copper for example, embedded in the interposer 101. For example, the interposer may include, by design, a thick copper pad directly behind the die to accomplish this. By utilizing the aforementioned thermally conductive material in the bond line 105, the back side of the die 115 may be directly coupled to the copper pad in the interposer 101 thus creating an integral heat spreader function in the package. The embedded thermal element may comprise conductive material that is thicker above the semiconductor die 115, with a thinner trace or traces to one or more of the metal contacts 107A away from the semiconductor die 115. In this manner, heat may be efficiently coupled out of the semiconductor die 115.

Furthermore, the embedded thermal element 125, along with the other conductive structures essentially surrounding the semiconductor die 115, such as the metal contacts 107A and 107B, and metal layers 117, may comprise an electromagnetic interference (EMI) shield for the semiconductor die 115.

Figure 3:
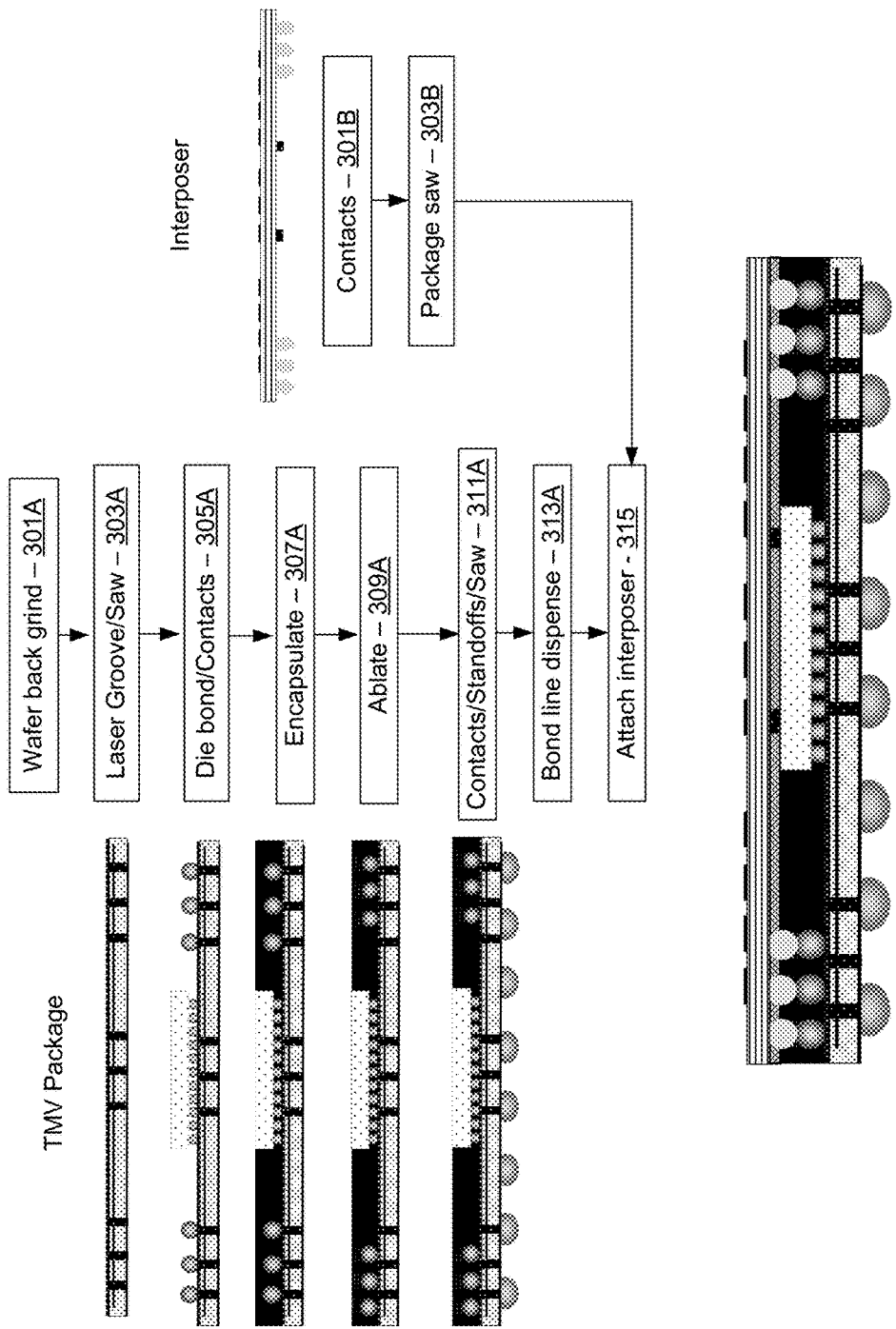
FIG. 3 illustrates example steps in forming a thin bonded interposer package, in accordance with an example embodiment of the disclosure.

FIG. 3 illustrates example steps in forming a thin bonded interposer package, in accordance with an example embodiment of the disclosure. Referring to FIG. 3, there is shown parallel process paths, one for the interposer and the other for the base through-mold via (TMV) package. The processes may be performed in parallel, although not necessarily, and the resulting structures are shown next to the process steps in FIG. 3.

Considering the base TMV package process first, a wafer that the semiconductor die may be separated from may receive a back grind in step 301A to thin the die to a desired thickness. In step 303A, the wafer may be cut utilizing a laser or saw, resulting in individual semiconductor die.

In step 305A, one or more of the diced semiconductor die may be bonded to the substrate utilizing a thermal compression process with non-conductive paste, for example, although other bonding techniques may be utilized. Solder balls or conductive bumps on the die may be bonded to contact pads on the substrate. In addition, In step 305A, solder balls may be attached to the top surface of the substrate to at least the pads that will eventually be electrically connected to the interposer.

In step 307A an encapsulant or mold material, such as an epoxy, may be formed around the semiconductor die and on the top surface of the substrate. The mold material may be formed to be coplanar with the top surface of the die, or may be formed on top of the die and then ground down to be coplanar, for example.

In step 309A, grooves or vias may be formed in the mold material to expose contact pads on the substrate (e.g., the aforementioned solder balls formed in step 305A). The grooves or vias may be formed by laser ablation, for example, or other etching/ablation process. Contact openings may thereby be formed to expose the contacts applied in step 305A, and may comprise solder balls as previously stated, but also, copper posts, or other suitable metal contact structures. In addition, standoffs, which may comprise solder resist, for example, may be formed at this step on the top surface of the package if they will not otherwise be included vis-a-vis the interposer, although they may be formed any time before the bond line dispense step (e.g. dispensed or applied standoff material of any appropriate type). Finally, if the TMV package is in strip form, the strip may be sawn into a plurality of TMV packages.

Next, considering the interposer fabrication steps, an interposer wafer may be processed, in that metal contacts, such as solder balls or copper pillars, may be formed on the backside of the interposer in step 301B. Although solder balls are shown, other contact types may be utilized. The metal contacts may be placed for bonding to the metal contacts formed on the TMV package. In another example scenario, the interposer may be received with metal pads already formed and finished on the bottom surface. In addition metal pads may be formed on the top surface of the interposer for receiving semiconductor die or other devices.

The interposer strip may then be sawn, diced, or cut into individual interposer substrates in step 303B. In step 315, the interposer may be bonded to the TMV package, with the contacts formed on the interposer coinciding with contacts in the vias formed in the mold material on the TMV package. In an example scenario, the interposer may be smaller than the TMV package in the lateral directions independent of thickness, as opposed to being equal in size. While FIG. 3 shows as drawn, and reference to "the interposer strip" might imply an organic laminate interposer, this is not exclusively the case. The interposer element may comprise any appropriate material or materials including silicon or glass-based interposers.

The standoffs formed on the bonded die or interposer may ensure a minimum bond line thickness and may also ensure uniform thickness of the bond line and good planarity of the interposer when bonded to the TMV substrate under pressure. Not only the uniformity of the bond line thickness, but also the absolute value of the thickness may be controlled by the thickness of the standoffs in that during bonding the interposer is "bottomed out" on the standoffs touching the backside of the die. Without standoffs, the bond line may have some natural thickness variation due to the inherent warpage behavior of the interposer and base package.

Figures 4A, 4B:
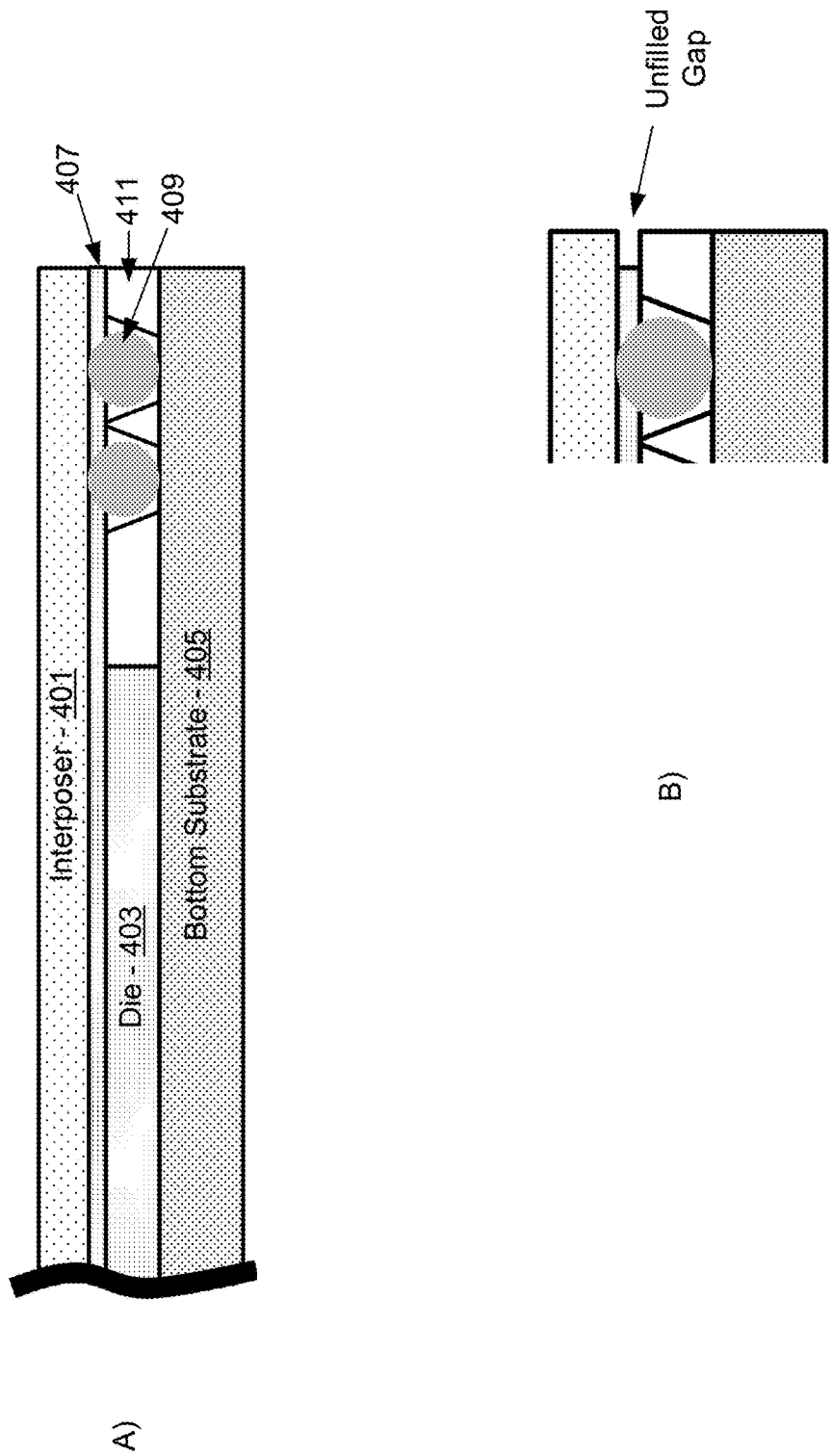
FIGS. 4A-4B illustrates an expanded unit pitch on strip method of forming a thin bonded interposer package, in accordance with an example embodiment of the disclosure.

FIGS. 4A-4B illustrates an expanded unit pitch on strip method of forming a thin bonded interposer package, in accordance with an example embodiment of the disclosure. Referring to FIG. 4A, there is shown a portion of an interposer 401, a semiconductor die 403, a bottom substrate 405, a bond line 407, metal contacts 409, and mold material 411. FIG. 4 illustrates the edge portion of the thin bonded interposer package described with respect to FIGS. 1-3.

The metal contacts 409 may provide electrical connectivity between the substrate 405 and the interposer 401 and may be encapsulated, along with the semiconductor die 403, by the mold material 411. The metal contacts 409 may comprise conductive balls (e.g., solder balls), either a single ball between the interposer 401 and substrate 405, or a stack of two or more conductive balls, or copper pillars, for example.

In an example scenario, the package shown in FIG. 4A may be fabricated in a strip-based process that creates full body coverage in the bond line, such that the bond line may be over dispensed using expanded pitch and slightly larger than required interposer body size. The final package edge may then be formed by sawing or cutting the package. In unit-based processes, tight precision in the dispense process is needed to control the final position of the adhesive bond line edge because the process is a unit to unit approach and over dispensing might be considered a defect with the adhesive oozing out at the package edge. To avoid this defect, the volume of dispensed adhesive may be controlled such that after bonding the bond line material only flows out to the extent shown in FIG. 4B.

The strip-based process is described further with respect to FIGS. 5A-5B and 6A-6B. FIG. 4A illustrates the completed structure with the edge of the bond line 407 coinciding with the edge of the interposer 401 and bottom substrate 405 without the need for accurate control in forming the bond line 407. The inset on the bottom right, FIG. 4B, shows a structure that was not fabricated using the strip-based process with the incompletely filled gap between the interposer and substrate. The method that produces this condition is illustrated in FIG. 3 where the interposer attach [step 315]

may be performed at the unit level such that individual interposers are attached to individual base TMV packages.

Figures 5A, 5B:
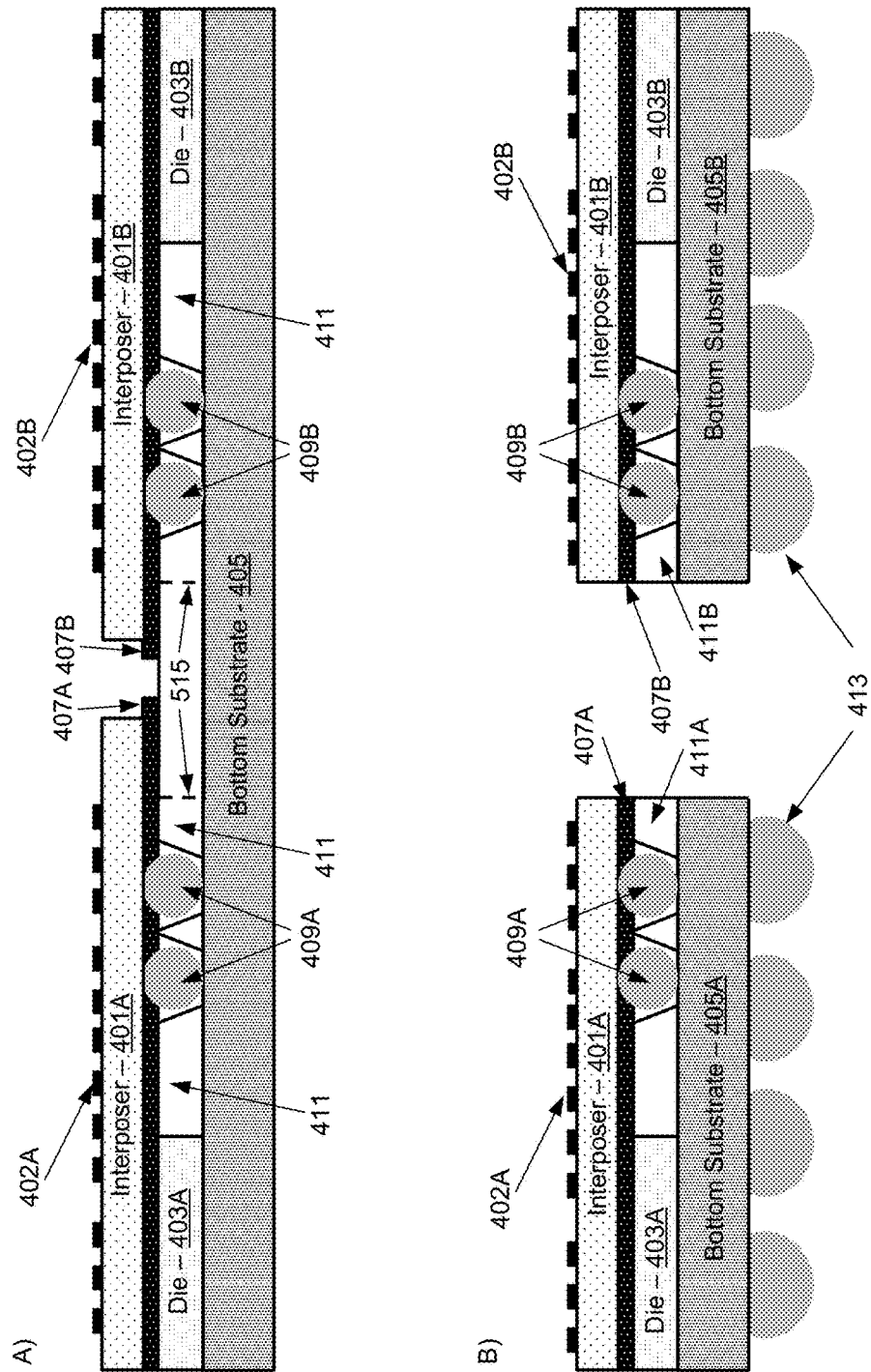
FIGS. 5A and 5B illustrate process steps in an expanded unit pitch on strip method of forming a thin bonded interposer package, in accordance with an example embodiment of the disclosure.

FIGS. 5A and 5B illustrate process steps in an expanded unit pitch on strip method of forming a thin bonded interposer package, in accordance with an example embodiment of the disclosure. Referring to FIG. 5A, there is shown interposers 401A and 401B, semiconductor die 403A and 403B, a bottom substrate 405, bond lines 407A and 407B, metal contacts 409A and 409B, mold material 411, and metal contacts 402A and 402B.

The bottom substrate may comprise a strip or panel of individual substrates. A plurality of individual die and interposers, such as the semiconductor die 403A and 403B and the interposers 401A and 401B, may be bonded to the bottom substrate 405 utilizing the bond lines 407A and 407B and electrically coupled using the metal contacts 409A and 409B. The interposers 401A and 401B may comprise metal and dielectric layers for providing electrical connectivity between contacts on the lower surface, such as those coupled to the metal contacts 409A and 409B, to metal contacts 402A and 402B on the top surface.

In an example scenario, the pitch, or spacing center-to-center, of the units may be increased from a standard saw street of ~250 µm, and the interposers 401A and 401B may be of increased size so as to extend beyond the eventual location of the sawn edge, as illustrated by the dashed vertical saw lines 515 in FIG. 5A. The adhesive for the bond lines 407A and 407B may be dispensed beyond the edge of the saw lines 515 and the interposers 401A and 401B. Though shown as separated by a gap, the adhesive for the bond lines 407A and 407B may be continuous. Thus, the control of the extent of the dispensed adhesive is not critical, since the entire structure comprising the interposers 401A and 401B, the mold material 411, and the bottom substrate 405 may be cut at the saw lines 515, resulting in coplanar package edges with the bond lines 407A and 407B up to the edge of the package, as illustrated in FIG. 5B.

In addition, the metal contacts 413 may be formed after the bonding of the interposers 401A and 401B, which may allow higher bonding force to be applied to the interposers during bonding and allows for the use of a thermal compression bonding technique, if desired. In an example scenario, the metal contacts 413 may comprise solder balls for a ball grid array, but may comprise other contact types, depending on the application. Similarly, the metal contacts 402A and 402B are shown as metal pads, but may also comprise solder lands or copper pads, for example, depending on the devices to be bonded to the top surface.

Furthermore, by providing an interposer that extends across the entire structure, a flexible bonding arrangement is possible for devices to be mounted on top, since the metal contacts 402A and 402B may be placed in any arrangement across the top surface. Similarly, as described with respect to FIG. 2, the interposers 401A and 401B may also comprise an embedded thermal element comprising thermally conductive epoxy and/or solderable material.

Figures 6A, 6B:
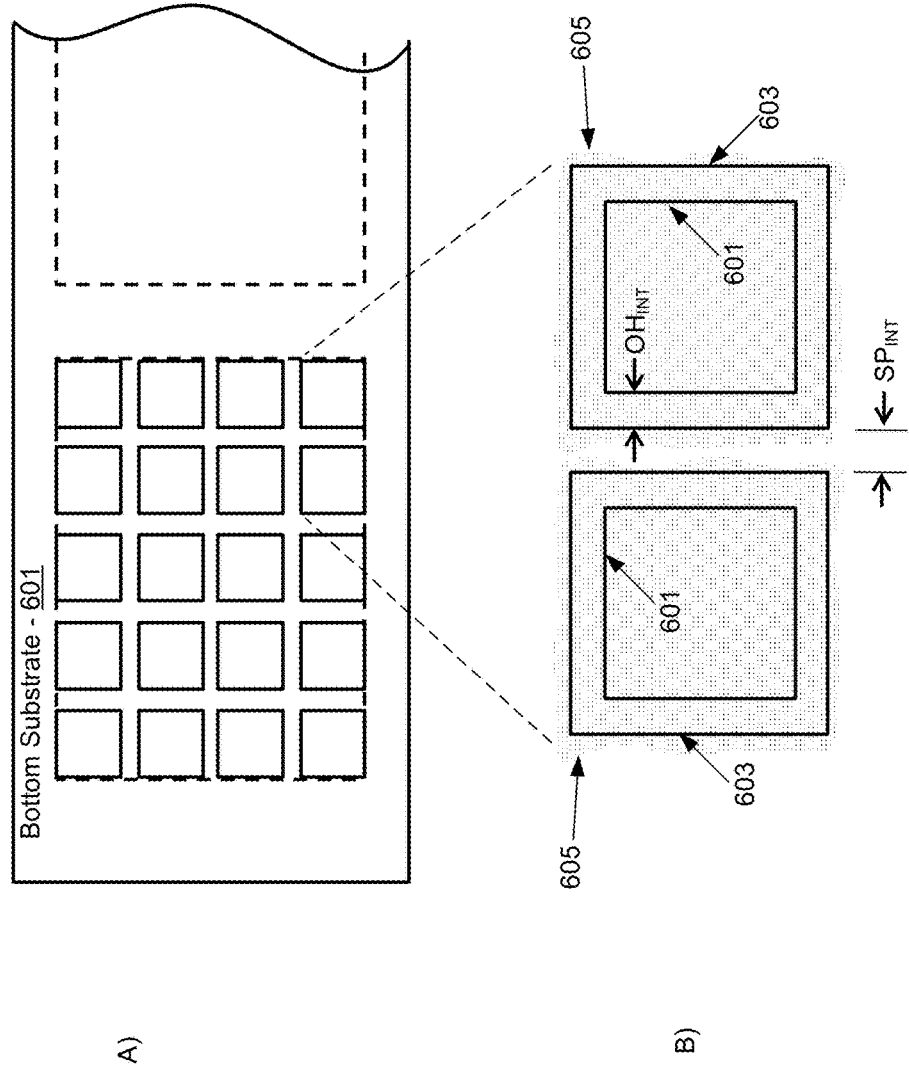
FIGS. 6A and 6B illustrate plan views of an expanded unit pitch on strip method of forming a thin bonded interposer package, in accordance with an example embodiment of the disclosure.

FIGS. 6A and 6B illustrate plan views of an expanded unit pitch on strip method of forming a thin bonded interposer package, in accordance with an example embodiment of the disclosure. Referring to FIG. 6A, there is shown a bottom substrate 601 in a strip form with multiple sites for bonding semiconductor die and forming mold material. While sections, or blocks, of 4×5 individual substrates are shown in the bottom substrate 601, other arrangements are possible, depending on strip and die size, and handling equipment, for example. In an example scenario, the interposers may be bonded to the bottom substrate 601 individually, in block form, or strip form.

FIG. 6B illustrates the outlines of the stack before sawing. The saw line 601 indicates the package outline once it has been sawn, and the interposer outline 603 indicates the outline of the interposer when bonded, while the dispensed bond line 605 extends beyond both outlines. In this manner, it is not necessary to accurately control the outer edge of the dispensed adhesive in forming the bond lines 605, since it will ultimately be sawn at the saw line 601. Therefore, the expanded unit pitch in the individual units and widened saw streets allow the subsequent bonding of slightly oversized interposers.

The overhang of the interposer outline 603 over the saw line 601 is indicated by $OH_{INT}$ in FIG. 6B and the spacing between the individual substrates in the bottom substrate 601 is indicated by $SP_{INT}$. In an example scenario, $OH_{INT}$ may be on the order of 170 µm and $SP_{INT}$ may be ~100 µm, so that the maximum street width in the horizontal direction can be expanded to ~440 µm for the strip arrangement shown in FIG. 6A without affecting strip utilization, for example, compared to a smaller width of 250 µm.

Figures 7A, 7B:
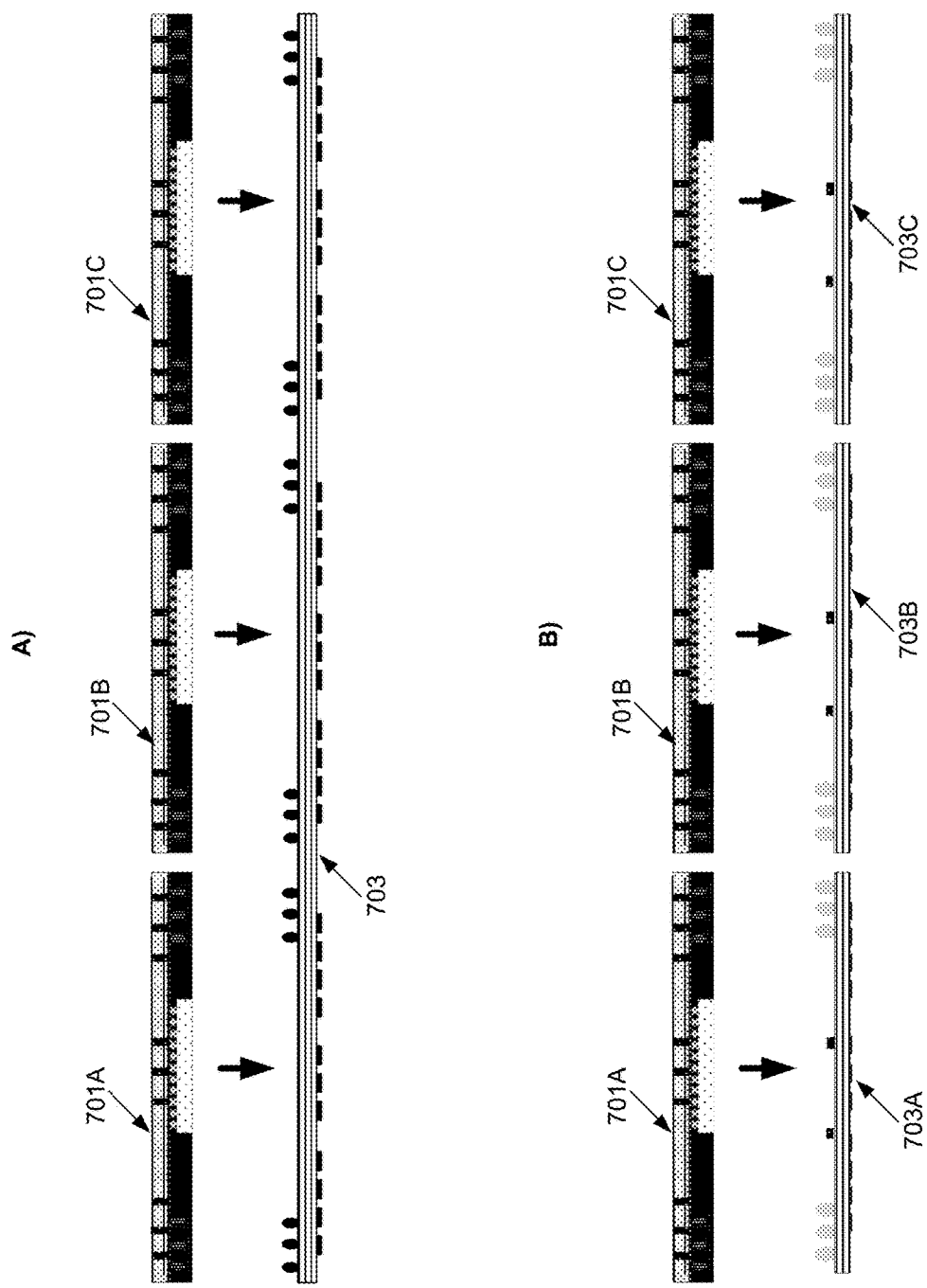
FIGS. 7A and 7B illustrate inverted interposer package bonding processes, in accordance with an example embodiment of the disclosure.

FIGS. 7A and 7B illustrate inverted interposer package bonding processes, in accordance with an example embodiment of the disclosure. Referring to FIG. 7A, there is shown TMV packages 701A-701C and an interposer strip 703. The TMV packages 701A-701C may be substantially similar to the structures described in FIGS. 1-6B, with substrates, bonded semiconductor die, and mold material, for example. Similarly, the strip interposer 703 may comprise metal contacts on the surfaces for bonding to the TMV packages 701A-701C and to other structures using the opposite surface.

Conventional bonding techniques comprise bonding interposers to base packages in the standard 'right side up' configuration, although it might be impractical to do so on packages in strip form, due to strip warpage issues. In an example scenario, the bonding process may be inverted with TMV unit packages being bonded to a strip interposer. Accordingly, the TMV packages 701A-701C may each be bonded to the strip interposer 703, and may be bonded using the extended strip line bonding technique described with respect to FIGS. 1-6B.

In addition, it should be pointed out that the solder balls on the TMV packages 701A-701C are not required, therefore enabling bonding techniques more favorable to flat surfaces (e.g., top of TMV packages 701 and bottom of interposer strip 703, such as thermal compression or gang bonding. In another exemplary scenario, both the TMV package and interposer may be in strip form when bonding.

FIG. 7B illustrates a similar bonding process to that shown in FIG. 7B, but with the interposer strip 703 separated into individual interposer die 703A-703C before bonding to the TMV packages 701A-701C, and may be bonded using the unit to unit method illustrated by the combination of FIGS. 1 and 3.

In an embodiment of the disclosure, a device is disclosed for a thin bonded interposer package. In this regard, aspects of the disclosure may comprise bonding a semiconductor die to a first surface of the substrate, forming contacts on the first surface of the substrate encapsulating the semiconductor die, formed contacts, and the first surface of the substrate using a mold material while leaving a top surface of the semiconductor die not encapsulated by mold material, and forming vias through the mold material to expose the formed contacts.

A bond line may be dispensed on the mold material and the semiconductor die, and the substrate may be bonded to an interposer using the dispensed bond line on the mold material and semiconductor die. The interposer may be electrically coupled to the metal contacts in the vias on the exposed portion of the first surface of the substrate using metal contacts formed on the interposer. A thickness of the bond line may be defined by solder resist standoffs formed on the top surface of the semiconductor die. The bond line may be dispensed laterally beyond outer edges of the interposer.

The interposer, mold material, bond line, and substrate may be sawn within outer edges of the interposer. The metal contacts in the vias on the exposed portion of the first surface of the substrate and the metal contacts formed on the interposer may comprise one or more of: solder balls or copper pillars. An embedded thermal element may be formed in the interposer, with the thermal element being in thermal contact with a surface of the semiconductor die.

The embedded thermal element may comprise one or both of: thermally conductive epoxy and solderable material. Metal contacts may be formed on a second surface of the substrate. Vias may electrically couple a subset of the metal contacts on the first surface of the substrate to a subset of the metal contacts on the second surface of the substrate. The interposer may be in strip form when the package is bonded to the interposer in an inverted interposer bonding process.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A semiconductor device comprising:
   a substrate having a top substrate side and a bottom substrate side;
   a semiconductor die having a top die side, a bottom die side bonded to the top substrate side, and a plurality of lateral die sides extending between the top die side and the bottom die side;
   a mold material encapsulating at least a respective portion of each of the lateral die sides and at least a portion of the top substrate side, wherein the top die side is not encapsulated by the mold material, and wherein the mold material comprises:
      a top mold side;
      a bottom mold side bonded to the top substrate side; and
      a through mold via (TMV) that extends through the mold material between the top and bottom mold sides;
   a metal post in the through mold via;
   a multi-layer signal distribution structure (SDS) having a top SDS side, and a bottom SDS side bonded to the top mold side and to the top die side, wherein:
      the multi-layer signal distribution structure is electrically coupled to the metal post through a metal contact on the bottom SDS side; and
      the multi-layer signal distribution structure comprises a contact pad on the top SDS side and positioned directly above the semiconductor die; and
   a bond layer directly on the top die side and the top mold side,
   wherein:
      the mold material comprises an inner portion that completely laterally surrounds the semiconductor die;
      the mold material comprises an outer portion that completely laterally surrounds the inner portion of the mold material;
      an entirety of the bond layer is continuous on the top die side and on an entire top side of the inner portion of the mold material; and
      an outermost edge of the bond layer does not reach a periphery of the multi-layer signal distribution structure.

2. The semiconductor device of claim 1, wherein:
   the substrate comprises a top side metal layer and a bottom side metal layer; and
   an uppermost surface of the substrate is lower than the bottom die side.

3. The semiconductor device of claim 1, wherein:
   the metal contact is directly connected to the metal post; and
   the multi-layer signal distribution structure comprises a second contact pad on the top SDS side and positioned directly above the mold material but not directly above the semiconductor die.

4. The semiconductor device of claim 1, wherein the bond layer covers an entire periphery of the top die side.

5. The semiconductor device of claim 1, wherein the mold material is molded around the metal post.

6. The semiconductor device of claim 1, wherein the metal post extends from the substrate top side at least as high as the top mold side.

7. The semiconductor device of claim 1, wherein the metal contact, through which the multi-layer signal distribution structure is electrically coupled to the metal post, comprises a conductive ball that is directly coupled to the metal post.

8. The semiconductor device of claim 1, wherein the multi-layer signal distribution structure is an interposer.

9. The semiconductor device of claim 1, wherein the top mold side is no higher than the top die side.

10. The semiconductor device of claim 1, wherein the multilayer signal distribution structure is laterally smaller than the substrate.

11. A semiconductor device comprising:
   a substrate;
   a semiconductor die bonded to an uppermost side of the substrate;
   an encapsulating material that encapsulates at least a portion of the semiconductor die and at least a portion of the substrate, wherein the encapsulating material comprises:
      a conductive through mold via (TMV) that extends upward from the substrate and through the encapsulating material;
      an inner encapsulating material portion that completely surrounds the semiconductor die; and
      an outer encapsulating material portion that completely surrounds the inner encapsulating material portion;
   an interposer coupled to the semiconductor die and to the encapsulating material, wherein the interposer is electrically coupled to the conductive TMV; and
   a continuous bond layer directly on the semiconductor die and directly on the entire inner encapsulating material portion, wherein a laterally outermost edge of the bond layer does not reach a periphery of the interposer.

12. The semiconductor device of claim 11, wherein:
the interposer comprises a first contact pad on a top side of the interposer and positioned directly above the semiconductor die;
the interposer comprises a second contact pad on the top side of the interposer and positioned directly above the encapsulating material but not directly above the semiconductor die; and
the interposer comprises a metal contact on a bottom side of the interposer, wherein the metal contact is directly connected to the conductive TMV.

13. The semiconductor device of claim 11, wherein:
the conductive TMV comprises a metal pillar; and
further comprising a solder ball that is directly coupled to the metal pillar and to the interposer.

14. The semiconductor device of claim 11, wherein the substrate comprises a top side metal layer and a bottom side metal layer.

15. The semiconductor device of claim 11, wherein the encapsulating material is a single molded layer molded around the conductive TMV.

16. A method of manufacturing a semiconductor device, the method comprising:
providing a semiconductor die bonded to an uppermost side of a substrate;
providing an encapsulating material that encapsulates at least a portion of the semiconductor die and at least a portion of the substrate, wherein the encapsulating material comprises:
a conductive through mold via (TMV) that extends upward from the substrate and through the encapsulating material;
an inner encapsulating material portion that completely surrounds the semiconductor die; and
an outer encapsulating material portion that completely surrounds the inner encapsulating material portion;
providing an interposer coupled to the semiconductor die and to the encapsulating material, wherein the interposer is electrically coupled to the conductive TMV; and
providing a continuous bond layer directly on the semiconductor die and directly on the entire inner encapsulating material portion, wherein a laterally outermost edge of the bond layer does not reach a periphery of the interposer.

17. The method of claim 16, wherein:
the interposer comprises a first contact pad on a top side of the interposer and positioned directly above the semiconductor die;
the interposer comprises a second contact pad on the top side of the interposer and positioned directly above the encapsulating material but not directly above the semiconductor die; and
the interposer comprises a metal contact on a bottom side of the interposer, wherein the metal contact is directly connected to the conductive TMV.

18. The method of claim 16, wherein:
the conductive TMV comprises a metal pillar; and
further comprising providing a solder ball that is directly coupled to the metal pillar and to the interposer.

19. The method of claim 16, wherein the substrate comprises a top side metal layer and a bottom side metal layer.

20. The method of claim 16, wherein the encapsulating material is a single molded layer molded around the conductive TMV.

* * * * *